United States Patent
Chung

(10) Patent No.: US 8,117,485 B2
(45) Date of Patent: Feb. 14, 2012

(54) MEMORY SYSTEM FOR SEAMLESS SWITCHING

(75) Inventor: Hoe-ju Chung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 396 days.

(21) Appl. No.: 12/379,276

(22) Filed: Feb. 18, 2009

(65) Prior Publication Data
US 2009/0282280 A1 Nov. 12, 2009

(30) Foreign Application Priority Data
May 8, 2008 (KR) .................. 10-2008-0042864

(51) Int. Cl.
*G06F 1/12* (2006.01)
(52) U.S. Cl. .......... 713/503; 365/201; 714/718; 714/719
(58) Field of Classification Search .................. 713/503; 714/718, 719, 721; 365/201
See application file for complete search history.

(56) References Cited

U.S. PATENT DOCUMENTS

| | | | |
|---|---|---|---|
| 7,447,954 B2 * | 11/2008 | Shin et al. | 714/718 |
| 7,593,288 B2 * | 9/2009 | Kim et al. | 365/233.12 |
| 7,689,879 B2 * | 3/2010 | Jeddeloh | 714/718 |
| 7,730,254 B2 * | 6/2010 | Risse | 711/105 |
| 2004/0246786 A1 | 12/2004 | Vogt | |
| 2005/0278495 A1 * | 12/2005 | Lee | 711/168 |
| 2007/0253277 A1 * | 11/2007 | Okuda | 365/233 |
| 2010/0083027 A1 * | 4/2010 | Oh | 713/601 |

FOREIGN PATENT DOCUMENTS
JP 2001-092572 4/2001
KR 10-0559736 3/2006
* cited by examiner

*Primary Examiner* — Glenn A Auve
(74) *Attorney, Agent, or Firm* — Harness, Dickey & Pierce

(57) ABSTRACT

Provided is a memory system for seamless switching. The memory system includes first through mth chips, where m is a natural number, connected in the form of a daisy chain and configured to transmit at least one of signals and data, a (k−1)th chip of the first through mth chips, where k is a natural number and 2≦k≦m, configured to output a (k−1)th detection signal corresponding to a phase difference between (k−1)th test data of the (k−1)th chip and kth test data of a kth chip of the first through mth chips, and the kth chip including a clock phase control unit configured to control a phase of a received clock signal and to output the phase-controlled clock signal as a kth clock signal, where the clock phase control unit of the kth chip outputs the kth clock signal in response to the (k−1)th detection signal.

20 Claims, 8 Drawing Sheets

MEMORY SYSTEM FOR SEAMLESS SWITCHING

PRIORITY STATEMENT

This application claims the benefit of Korean Patent Application No. 10-2008-0042864, filed on May 8, 2008, in the Korean Intellectual Property Office, the disclosure of which is incorporated herein in its entirety by reference.

BACKGROUND

1. Field

Example embodiments relate to a memory system, for example, to a memory system for seamless switching.

2. Description of the Related Art

A conventional memory system includes a memory controller and a memory module that is connected to the memory controller. In general, the number of memory modules connected to the memory controller is increased in order for the conventional memory system to have a larger capacity. In this case, since signal lines between the memory controller and the memory modules are connected by using a multi-drop method, which includes the memory modules sharing the same signal lines, a capacitive load increases and thus the conventional memory system may not operate at a high speed.

SUMMARY

Example embodiments provide a memory system for seamless switching, by which power consumption and latency increases may be minimized or reduced.

According to an embodiment of the present invention, there is provided a memory system includes first through mth chips, where m is a natural number, connected in the form of a daisy chain and configured to transmit at least one of signals and data, a (k−1)th chip of the first through mth chips, where k is a natural number and $2 \leq k \leq m$, configured to output a (k−1)th detection signal corresponding to a phase difference between (k−1)th test data of the (k−1)th chip and kth test data of a kth chip of the first through mth chips, and the kth chip including a clock phase control unit configured to control a phase of a received clock signal and to output the phase-controlled clock signal as a kth clock signal, where the clock phase control unit of the kth chip outputs the kth clock signal in response to the (k−1)th detection signal.

The clock phase control unit of the kth chip may output the kth clock signal in response to the (k−1)th detection signal so as not to generate the phase difference between the (k−1)th test data and the output test data of the kth chip.

The kth chip may further include a phase detection unit configured to output a kth detection signal, a test data generation unit configured to generate and output kth test data in response to the kth clock signal, and a control unit configured to output outputting a kth control signal in response to the kth clock signal.

The (k−1)th chip may further include a multiplexer (MUX) configured to select one of the (k−1)th test data and the output test data of the kth chip in response to a (k−1)th control signal, and to output the selected data as output test data of the (k−1)th chip.

The (k−1)th chip may further include a data parallel conversion unit configured to parallel-convert and output the output test data of the kth chip in response to a (k−1)th clock signal, a MUX configured to select and output one of the (k−1)th test data and output test data of the data parallel conversion unit in response to a (k−1)th control signal, and a data serial conversion unit configured to serial-convert output test data of the MUX in response to the (k−1)th clock signal, and to output the serial-converted output test data of the MUX as output test data of the (k−1)th chip, and the (k−1)th test data may be in a parallel form.

The (k−1)th detection signal may correspond to a phase difference between the (k−1)th test data and the output test data of the data parallel conversion unit of the (k−1)th chip.

An embodiment of the present invention may further include a memory controller configured to control the first through mth chips, where each of the first through mth chips may include one of a memory chip configured to include a memory core and to transmit data and to receive data from the memory controller, and an interface chip configured to transmit data to and receive data from a corresponding memory chip and the memory controller.

An embodiment of the present invention may further include a data serial conversion unit configured to output at least one of kth test data obtained by serial-converting received test data and kth data obtained by serial-converting read data, in response to the kth clock signal.

The (k−1)th chip may further include a multiplexer (MUX) configured to select one of the (k−1)th test data and the output test data of the kth chip in response to a (k−1)th control signal, and to output the selected data as output test data of the (k−1)th chip.

An embodiment of the present invention may also include a control unit configured to output a kth control signal in response to the kth clock signal, and a multiplexer (MUX) configured to select and output one of received data in response to the kth control signal, with the MUX of a (k−1)th chip selecting and outputting one of received (k−1)th test data and parallel-converted output test data of a kth chip, in response to a (k−1)th control signal.

The kth chip may further include a test data generation unit configured to generate the kth test data, a data parallel conversion unit configured to parallel-convert and output the output test data of the kth chip in response to a (k−1)th clock signal, and a data serial conversion unit configured to serial-convert output test data of the MUX in response to the (k−1)th clock signal, and to output the serial-converted output test data of the MUX as output test data of the (k−1)th chip.

The kth detection signal may correspond to a phase difference between the kth test data and the output test data of the data parallel conversion unit of the kth chip.

The kth chip may further include a control unit configured to output a kth control signal in response to the kth clock signal, and a temporary storage unit configured to at least one store and output kth data read from the memory core of the kth chip in response to the kth control signal, if the kth chip is the memory chip, and to at least one of store and output kth data read from the corresponding memory chip in response to the kth control signal, if the kth chip is the interface chip.

BRIEF DESCRIPTION OF THE DRAWINGS

The above and other features and advantages will become more apparent by describing in detail example embodiments with reference to the attached drawings in which.

DETAILED DESCRIPTION

Figure 1:
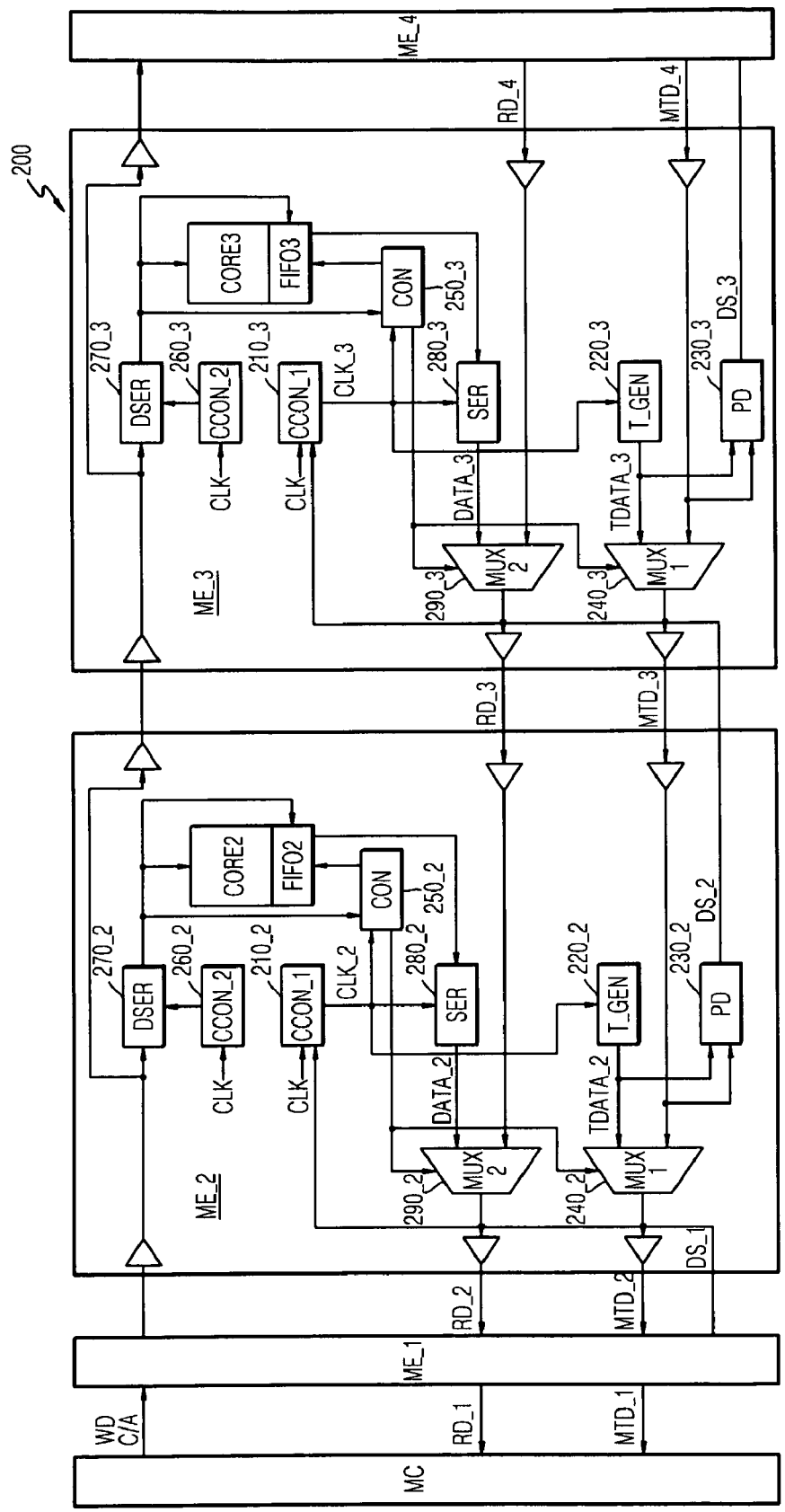
FIG. 1 is a block diagram of a memory system according to an embodiment of the present invention.

The attached drawings for illustrating example embodiments of the present invention are referred to in order to gain a sufficient understanding of the present invention, the merits thereof, and the objectives accomplished by the implementation of the present invention.

Hereinafter, example embodiments will be described in detail by explaining embodiments of the invention with reference to the attached drawings. Like reference numerals denote like elements in the drawings.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, example embodiments will be described in detail with reference to the attached drawings. However, example embodiments are not limited to the embodiments described herein, but may be embodied in various forms.

FIG. 1 is a block diagram of a memory system 200 according to an embodiment of the present invention.

Referring to FIG. 1, the memory system 200 may include a memory controller MC and first through fourth memory chips ME_1 through ME_4. For convenience of explanation, the memory system 200 includes four memory chips in FIG. 1. However, it will be appreciated that the memory system 200 may include greater or lesser number of memory chips.

The first through fourth memory chips ME_1 through ME_4 are connected in the form of a daisy chain so as to transmit signals or data. The memory controller MC controls the first through fourth memory chips ME_1 through ME_4. For example, the memory controller MC may transmit at least one of a command, an address and write data C/A/WD to the first through fourth memory chips ME_1 through ME_4, and receive data read from the first through fourth memory chips ME_1 through ME_4.

A method of transmitting a signal or data from each memory chip will be described in detail below by using the second and third memory chips ME_2 and ME_3, as an example. Although FIG. 1 illustrates detailed internal configurations of the second and third memory chips ME_2 and ME_3, it will be appreciated that the first and fourth memory chips ME_1 and ME_4 may also have the same internal configurations.

The second memory chip ME_2 includes a first clock phase control unit 210_2, a test data generation unit 220_2, a phase detection unit 230_2, a first multiplexer (MUX) 240_2, and a control unit 250_2. Also, the second memory chip ME_2 further includes a memory core CORE2, a temporary storage unit FIFO2, a second clock phase control unit 260_2, a data parallel conversion unit 270_2, a data serial conversion unit 280_2, and a second MUX 290_2.

The first clock phase control unit 210_2 controls a phase of a received clock signal CLK in response to a first detection signal DS_1 that is output from the first memory chip ME_1, and outputs the phase-controlled clock signal as a second clock signal CLK_2. The test data generation unit 220_2 generates and outputs second test data TDATA_2 in a serial form, in response to the second clock signal CLK_2. The phase detection unit 230_2 outputs a second detection signal DS_2 corresponding to a phase difference between the second test data TDATA_2 and output test data MTD_3 of the third memory chip ME_3, to a first clock phase control unit 210_3 of the third memory chip ME_3. The control unit 250_2 outputs a second control signal to the first MUX 240_2, the temporary storage unit FIFO2, and the second MUX 290_2, in response to the second clock signal CLK_2. The first MUX 240_2 selects one of the second test data TDATA_2 and the output test data MTD_3 of the third memory chip ME_3, in response to the second control signal, and outputs the selected data to the first memory chip ME_1 through an output buffer as output test data MTD_2 of the second memory chip ME_2.

When a read operation is performed, the temporary storage unit FIFO2 stores or outputs data read from the memory core CORE2. For example, the temporary storage unit FIFO2 stores data read from the memory core CORE2 and outputs the read data to the data serial conversion unit 280_2, in response to the second control signal. The data serial conversion unit 280_2 receives and serial-converts the input read data. The data serial conversion unit 280_2 outputs serial-converted data DATA_2 to the second MUX 290_2. The second MUX 290_2 selects one of the data DATA_2 output from the data serial conversion unit 280_2 and output data RD_3 of the third memory chip ME_3, in response to the second control signal, and outputs the selected data to the first memory chip ME_1 through an output buffer as output data RD_2 of the second memory chip ME_2. The second clock phase control unit 260_2 controls a phase of a received clock signal CLK and outputs the phase-controlled clock signal to the data parallel conversion unit 270_2. The data parallel conversion unit 270_2 parallel-converts and outputs the received command, address and write data C/A/WD, in response to an output signal of the second clock phase control unit 260_2, such as the phase-controlled clock signal. Although not shown in FIG. 1, the received command and address C/A may be decoded by a decoder and the write data WD may be written to the memory core CORE2 by using the decoded command and address C/A.

In a conventional memory system, when data is written in another memory chip, after a data parallel conversion unit converts the data, the data is re-converted by a data serial conversion unit and the serial-converted data is transmitted to another memory chip. However, in the memory system 200 according to an embodiment of the present invention, each chip does not perform the above-described conventional process. For example, the command and address C/A and the write data WD, which are received by the second memory chip ME_2, are neither parallel-converted nor serial-converted, but instead are directly output to the third memory chip ME_3 through an output buffer.

Hereinabove, the elements of the second memory chip ME_2 have been described. However, other memory chips may include the same elements and thus descriptions of the other memory chips will be omitted.

A method of determining a phase of a clock signal by using test data will now be described. For convenience of explanation, descriptions will be made with reference to the operations of the second and third memory chips ME_2 and ME_3.

The first clock phase control unit 210_2 of the second memory chip ME_2 controls a phase of a received clock signal CLK in response to a first detection signal DS_1 that is output from a phase detection unit of the first memory chip ME_1, and outputs the phase-controlled clock signal as a second clock signal CLK_2. The test data generation unit 220_2 generates and outputs second test data TDATA_2 in a serial from, in response to the second clock signal CLK_2. Also, the control unit 250_2 generates the second control signal in response to the second clock signal CLK_2. The first MUX 240_2 selects and outputs one of the second test data TDATA_2 and the output test data MTD_3 of the third memory chip ME_3, in response to the second control signal. In this case, the phase detection unit 230_2 outputs a second detection signal DS_2 corresponding to a phase difference between the second test data TDATA_2 and the output test data MTD_3 of the third memory chip ME_3, to a first clock phase control unit 210_3 of the third memory chip ME_3. The first clock phase control unit 210_3 of the third memory chip ME_3 outputs a third clock signal CLK_3 that is obtained by controlling a phase of a received clock signal CLK, in response to the second detection signal DS_2. For example, the first clock phase control unit 210_3 generates the third clock signal CLK_3 in response to the second detection signal DS_2 so as not to generate the phase difference between the second test data TDATA_2 and the output test data MTD_3 of the third memory chip ME_3. Also, a test data generation unit 220_3 of the third memory chip ME_3 operates in response to the third clock signal CLK_3 and thus the test data generation unit 220_3 of the third memory chip ME_3 generates and outputs third test data TDATA_3 so as not to generate a phase difference between the second test data TDATA_2 and the output test data MTD_3 of the third memory chip ME_3. A control unit 250_3 of the third memory chip ME_3 generates a third control signal in response to the third clock signal CLK_3. A first MUX 240_3 of the third memory chip ME_3 selects and outputs one of the third test data TDATA_3 and output test data MTD_4 of the fourth memory chip ME_4, in response to the third control signal. The above-described operation may be performed in the same manner in other memory chips, for example, the memory chips ME_1 and ME_4.

A method of performing a read operation by using a phase-controlled clock signal will now be described. As described above, a read command is decoded when the read command is received, and the read operation is performed in a corresponding memory core, in response to the decoded read command. The second memory chip ME_2 is representatively described. Data is read from the memory core CORE2 in response to the decoded read command, and the read data is temporarily stored in the temporary storage unit FIFO2. The control unit 250_2 generates the second control signal in response to the second clock signal CLK_2. The temporary storage unit FIFO2 outputs data to the data serial conversion unit 280_2 in response to the second control signal, and the data serial conversion unit 280_2 serial-converts the data and outputs serial-converted data DATA_2 to the second MUX 290_2. The second MUX 290_2 selects one of the serial-converted data DATA_2 output from the data serial conversion unit 280_2 and the output data RD_3 of the third memory chip ME_3, in response to the second control signal, and outputs the selected data as output data RD_2 of the second memory chip ME_2. The above-described operation may be performed in the same manner in other memory chips, for example, the memory chips ME_1, ME_3 and ME_4. Data RD_1 through RD_4, which are respectively output from the first through fourth memory chips ME_1 through ME_4, are in a serial form.

For example, a first clock phase control unit of each memory chip controls a phase of a clock signal in response to a detection signal of a previous memory chip, and a control unit of each memory chip outputs a control signal in response to the phase-controlled clock signal. A data serial conversion unit of each memory chip serial converts read data in response to the phase-controlled clock signal, and a second MUX of each memory chip selects and outputs one of two types of input data, in response to the control signal, and thus, seamless switching may be implemented.

Figure 2:
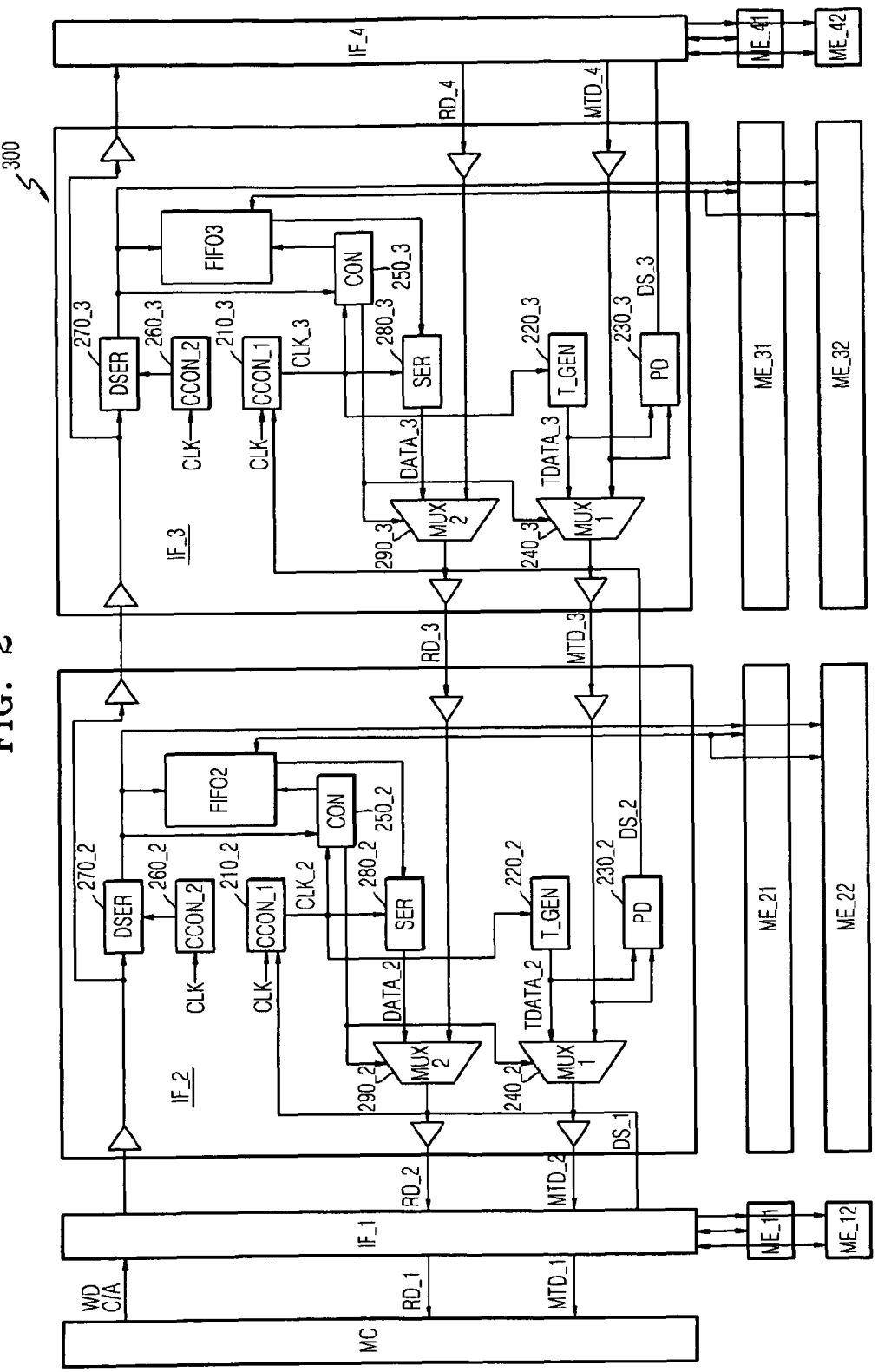
FIG. 2 is a block diagram of a memory system according to another embodiment of the present invention.

FIG. 2 is a block diagram of a memory system 300 according to another embodiment of the present invention.

Referring to FIG. 2, the memory system 300 includes a memory controller MC and first through fourth interface chips IF_1 through IF_4. Also, the memory system 300 includes a plurality of memory chips ME_11 and ME_12 corresponding to the first interface chip IF_1, a plurality of memory chips ME_21 and ME_22 corresponding to the second interface chip IF_2, a plurality of memory chips ME_31 and ME_32 corresponding to the third interface chip IF_3, and a plurality of memory chips ME_41 and ME_42 corresponding to the fourth interface chip IF_4. For convenience of explanation, the memory system 300 includes four interface chips with two memory chips corresponding to each interface chip in FIG. 2. However, it will be appreciated that the memory system 300 may include greater or lesser number of interface chips or memory chips.

Unlike the first through fourth memory chips ME_1 through ME_4 illustrated in FIG. 1, each of the first through fourth interface chips IF_1 through IF_4 of the memory system 300 does not include a memory core in which data is stored. Instead, each of the first through fourth interface chips IF_1 through IF_4 exchanges signals and data with its corresponding memory chips. Each element of the first through fourth interface chips IF_1 through IF_4 may function in the same manner as its corresponding element of the first through fourth memory chips ME_1 through ME_4 illustrated in FIG. 1, and thus detailed descriptions thereof will be omitted here. The memory system 300 determines a phase of a clock signal by using test data, as described above for the memory system 200 illustrated in FIG. 1. However, when the memory system 300 performs a read operation, data read from each memory chip is stored in a temporary storage unit of its corresponding interface chip. For example, if data is read from the memory chip ME_22, the data is stored in a temporary storage unit FIFO2 of the second interface chip IF_2. A method of transmitting read data to the memory controller MC by using the data stored in the temporary storage unit FIFO2 is described in detail above with reference to FIG. 1, and thus detailed descriptions thereof will be omitted here. Further, unlike the memory system 200 of FIG. 1, each of the temporary storage units FIFO2 of the memory system 300 of FIG. 2 may store or output data read from a plurality of memory cores (not shown), where each memory chip ME_11 through ME_42 may include at least one memory core.

Figure 3:
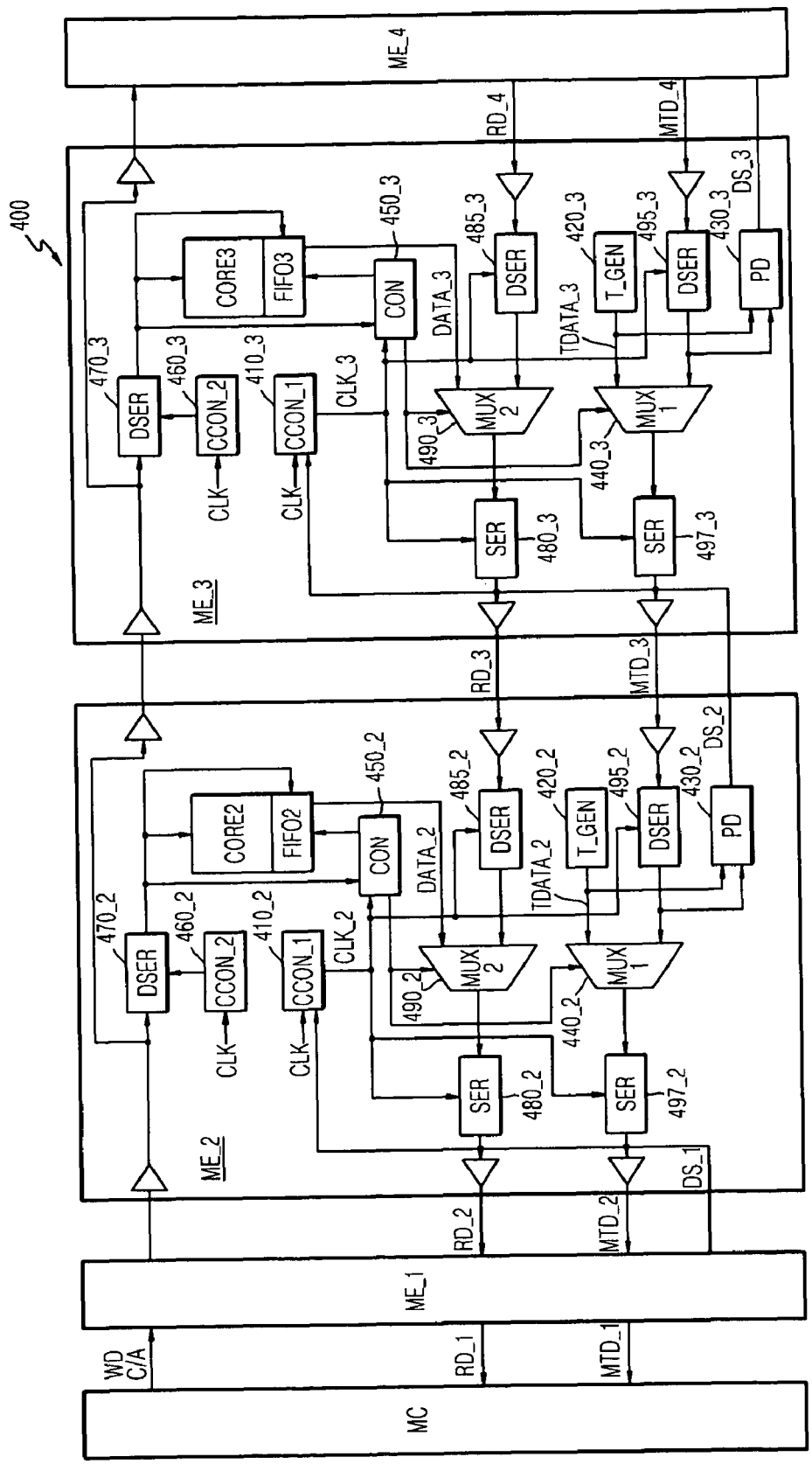
FIG. 3 is a block diagram of a memory system according to another embodiment of the present invention.

FIG. 3 is a block diagram of a memory system 400 according to another embodiment of the present invention.

As described above with reference to FIG. 1, although FIG. 3 illustrates detailed internal configurations of second and third memory chips ME_2 and ME_3, it will be appreciated that first and fourth memory chips ME_1 and ME_4 may also have the same internal configurations. In FIG. 3, a method of transmitting a signal or data from each memory chip will now be described in detail representatively with respect to the second and third memory chips ME_2 and ME_3.

Referring to FIG. 3, a first clock phase control unit 410_2, a test data generation unit 420_2, a phase detection unit 430_2, a first MUX 440_2, a control unit 450_2, a memory core CORE2, a temporary storage unit FIFO2, a second clock phase control unit 460_2, a data parallel conversion unit 470_2, a data serial conversion unit 480_2, and a second MUX 490_2 which are included in the second memory chip ME_2, operate the same as their corresponding elements of the second memory chip ME_2 of the memory system 200 illustrated in FIG. 1, and thus detailed descriptions thereof will be omitted here.

Unlike the memory system 200 illustrated in FIG. 1, in the memory system 400, the phase detection unit 430_2 may detect a phase difference between two types of data in a parallel form. For example, the test data generation unit 420_2 generates and outputs test data TDATA_2 in a parallel form. Also, a data parallel conversion unit 495_2 parallel-converts and outputs output test data MTD_3 of the third memory chip ME_3. The first MUX 440_2 selects and outputs one of output test data of the test data generation unit 420_2 and output test data of the data parallel conversion unit 495_2, in response to a second control signal output from the control unit 450_2. A data serial conversion unit 497_2 serial-converts output test data of the first MUX 440_2 and outputs the serial-converted data as output test data MTD_2 of the second memory chip ME_2. The above-described operation may be performed in the same manner in other memory chips, for example, the memory chips ME_1, ME_3 and ME_4.

In this case, the phase detection unit 430_2 detects a phase difference between the output test data of the test data generation unit 420_2 and the output test data of the data parallel conversion unit 495_2, and outputs the detected phase difference to the third memory chip ME_3, as a second detection signal DS_2. The output test data of the test data generation unit 420_2 and the output test data of the data parallel conversion unit 495_2 are in a parallel form. For example, according to the current embodiment of the present invention, the phase detection unit 430_2 detects a phase difference between two types of data that are in a parallel form. In this case, the number of times that parallel conversion is performed may be reduced in comparison to a conventional memory system. For example, assuming the conventional memory system performs the parallel conversion of data in units of eight bits, the memory system 400 controls a phase of a clock signal in response to the detection signal and thus, according to the current embodiment of the present invention, seamless switching may be implemented even if, for example, the parallel conversion of data is performed in units of four bits or in units of two bits.

Likewise, when a read operation is performed, data that is read in response to a read command is output from the temporary storage unit FIFO2 to the second MUX 490_2 in response to the second control signal. Also, a data parallel conversion unit 485_2 parallel-converts and outputs output data RD_3 of the third memory chip ME_3. The second MUX 490_2 selects and outputs one of output data of the temporary storage unit FIFO2 and output data of the data parallel conversion unit 485_2, in response to the second control signal. The data serial conversion unit 480_2 serial-converts output data of the second MUX 490_2, and outputs the serial-converted data as output data RD_2 of the second memory chip ME_2. The read operation is performed the same in other memory chips. As described above, according to the current embodiment of the present invention, the number of times that parallel conversion is performed may be reduced in comparison to a conventional memory system, and thus, seamless switching may be implemented by minimizing or reducing power consumption and latency increases.

Figure 4:
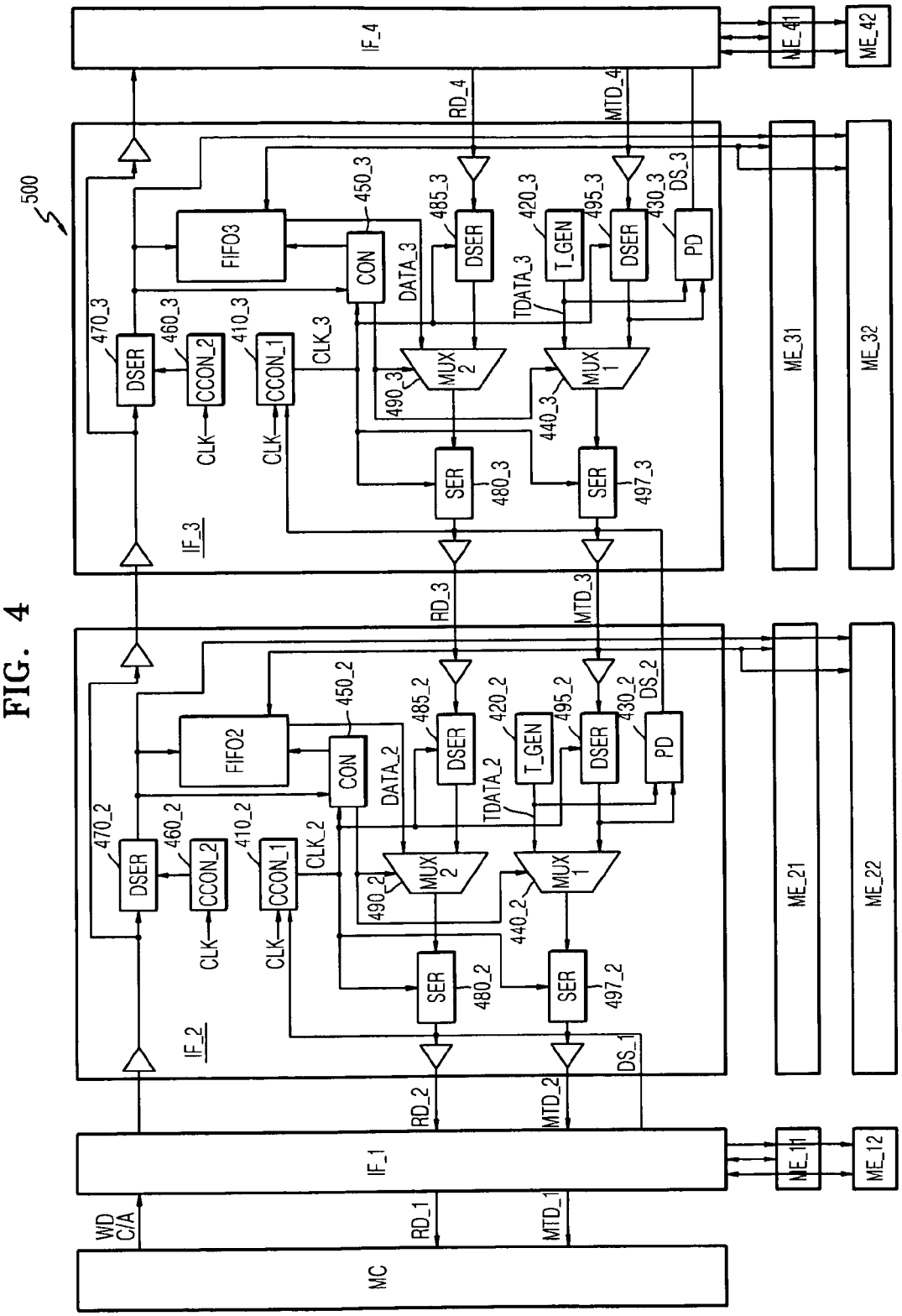
FIG. 4 is a block diagram of a memory system according to another embodiment of the present invention.

FIG. 4 is a block diagram of a memory system 500 according to another embodiment of the present invention.

Referring to FIG. 4, the memory system 500 may include a memory controller MC, first through fourth interface chips IF_1 through IF_4, and a plurality of memory chips ME_11 and ME_12, ME_21 and ME_22, ME_31 and ME_32, and ME_41 and ME_42 which respectively correspond to the first through fourth interface chips IF_1 through IF_4. For example, the memory system 500 includes the plurality of memory chips ME_11 and ME_12 corresponding to the first interface chip IF_1, the plurality of memory chips ME_21 and ME_22 corresponding to the second interface chip IF_2, the plurality of memory chips ME_31 and ME_32 corresponding to the third interface chip IF_3, and the plurality of memory chips ME_41 and ME_42 corresponding to the fourth interface chip IF_4.

Unlike the first through fourth memory chips ME_1 through ME_4 illustrated in FIG. 3, each of the first through fourth interface chips IF_1 through IF_4 of the memory system 500 does not include a memory core in which data is stored. Further, each of the first through fourth interface chips IF_1 through IF_4 exchange signals and data with their corresponding memory chips. Each element of the first through fourth interface chips IF_1 through IF_4 may function the same as its corresponding element of the first through fourth memory chips ME_1 through ME_4 illustrated in FIG. 3, and thus detailed descriptions thereof will be omitted here. The memory system 500 may determine a phase of a clock signal by using test data, as described above for the memory system 400 illustrated in FIG. 3. However, when the memory system 500 performs a read operation, data read from each memory chip is stored in a temporary storage unit of its corresponding interface chip. For example, if data is read from the memory chip ME_22, the data is stored in a temporary storage unit FIFO2 of the second interface chip IF_2. A method of transmitting read data to the memory controller MC by using the data stored in the temporary storage unit FIFO2 is described in detail above with reference to FIG. 3, and thus detailed descriptions thereof will be omitted here.

Further, unlike the memory system 400 of FIG. 3, each of the temporary storage units FIFO2 of the memory system 500 of FIG. 4 may store or output data read from a plurality of memory cores (not shown), where each memory chip ME_11 through ME_42 may include at least one memory core.

Figure 5:
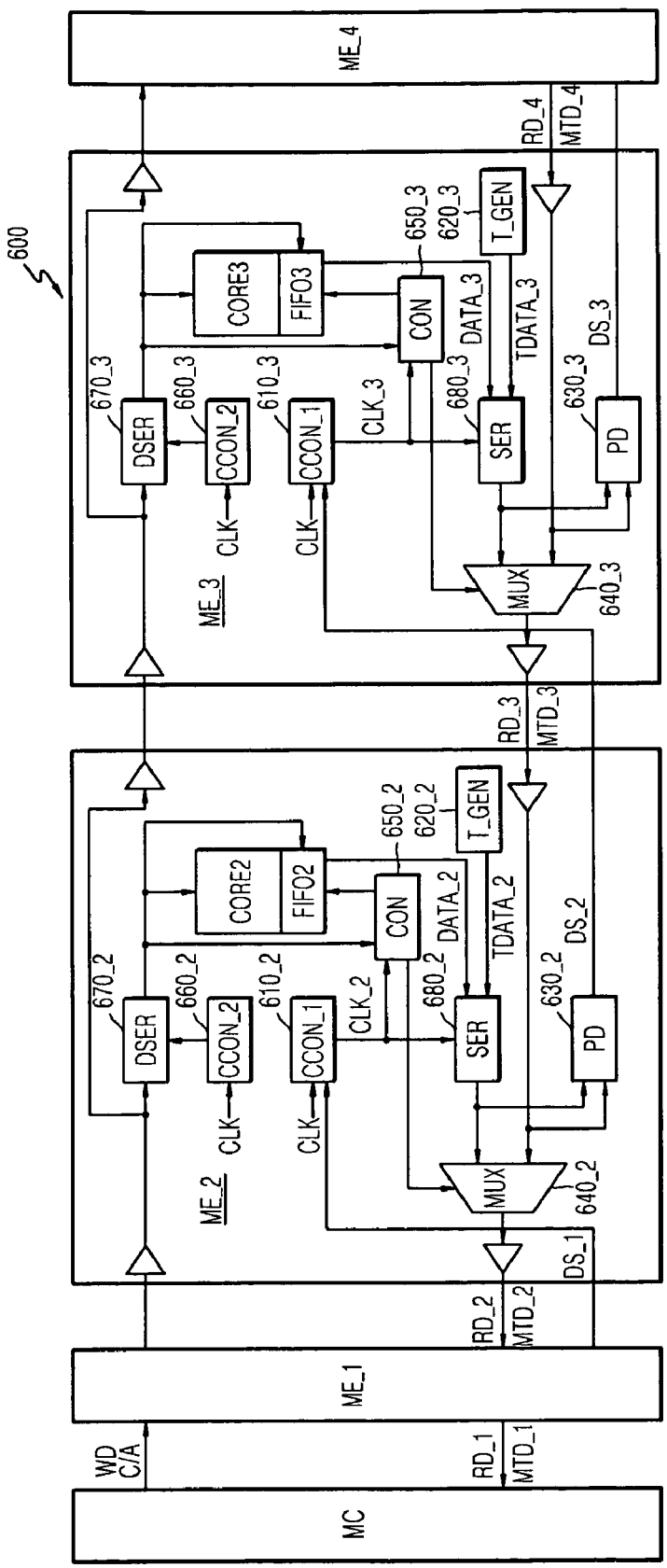
FIG. 5 is a block diagram of a memory system according to another embodiment of the present invention.

FIG. 5 is a block diagram of a memory system 600 according to another embodiment of the present invention.

Although the memory system 200 illustrated in FIG. 1 uses difference paths when the memory system 200 uses test data and when the memory system 200 performs a read operation, the memory system 600 uses the same path when the memory system 600 uses test data and when the memory system 600 performs a read operation. A method of controlling a phase of a clock signal and generating a control signal by using test data, and a method of performing a read operation by using the phase-controlled clock signal, will now be described in detail.

Initially, the method of controlling a phase of a clock signal and generating a control signal by using test data will now be described. For convenience of explanation, descriptions will be made on the operations of second and third memory chips ME_2 and ME_3.

Referring to FIG. 5, in the second memory chip ME_2, a first clock phase control unit 610_2 controls a phase of a received clock signal CLK in response to a first detection signal DS_1 that is output from a first memory chip ME_1, and outputs the phase-controlled clock signal as a second clock signal CLK_2. A test data generation unit 620_2 generates and outputs second test data TDATA_2. The second test data TDATA_2 of the memory system 200 illustrated in FIG. 1 is in a serial form. However, the second test data TDATA_2 of the memory system 600 is in a parallel form. Thus, a data serial conversion unit 680_2 serial-converts and outputs the second test data TDATA_2. A control unit 650_2 generates the second control signal in response to the second clock signal CLK_2. A MUX 640_2 selects and outputs one of output test data of the data serial conversion unit 680_2 and output test data MTD_3 of the third memory chip ME_3, in response to the second clock signal CLK_2. In this case, a phase detection unit 630_2 outputs a second detection signal DS_2 corresponding to a phase difference between the output test data of the data serial conversion unit 680_2 and the output test data MTD_3 of the third memory chip ME_3, to a first clock phase control unit 610_3 of the third memory chip ME_3. The first clock phase control unit 610_3 of the third memory chip ME_3 outputs a third clock signal CLK_3 that is obtained by controlling a phase of a received clock signal CLK, in response to the second detection signal DS_2. For example, the first clock phase control unit 610_3 generates the third clock signal CLK_3 in response to the second detection signal DS_2 so as not to generate the phase difference between the output test data of the data serial conversion unit 680_2 and the output test data MTD_3 of the third memory chip ME_3. Also, a control unit 650_3 of the third memory chip ME_3 generates a third control signal in response to the third clock signal CLK_3. A MUX 640_3 of the third memory chip ME_3 selects and outputs one of output test data of a data serial conversion unit 680_3 of the third memory chip ME_3 and output test data MTD_4 of a fourth memory chip ME_4, in response to the third control signal. The above-described operation may be performed the same in other memory chips, for example, the memory chips ME_1 and ME_4.

The method of performing a read operation by using a phase-controlled clock signal will now be described. As described above, a read command is decoded when the read command is received, and the read operation is performed in a corresponding memory core, in response to the decoded read command. The second memory chip ME_2 is representatively described. Data is read from a memory core CORE2 in response to the decoded read command, and the read data is temporarily stored in a temporary storage unit FIFO2. The control unit 650_2 generates the second control signal in response to a second clock signal CLK_2. The temporary storage unit FIFO2 outputs data DATA_2 to the data serial conversion unit 680_2 in response to the second control signal, and the data serial conversion unit 680_2 serial-converts the data DATA_2 and outputs serial-converted data to the MUX 640_2. The MUX 640_2 selects one of output data of the data serial conversion unit 680_2 and output data RD_3 of the third memory chip ME_3, in response to the second control signal, and outputs the selected data as output data RD_2 of the second memory chip ME_2. The above-described operation may be performed in the same manner in other memory chips, for example, the memory chips ME_1 and ME_4. Output data RD_1 through RD_4, which are respectively output from the first through fourth memory chips ME_1 through ME_4, are in a serial form.

The memory system 600 may perform the above-described operation when the memory system 600 is paused, for example, in a refresh section, as well as in an initialization step, and thus, seamless switching may be implemented.

Figure 6:
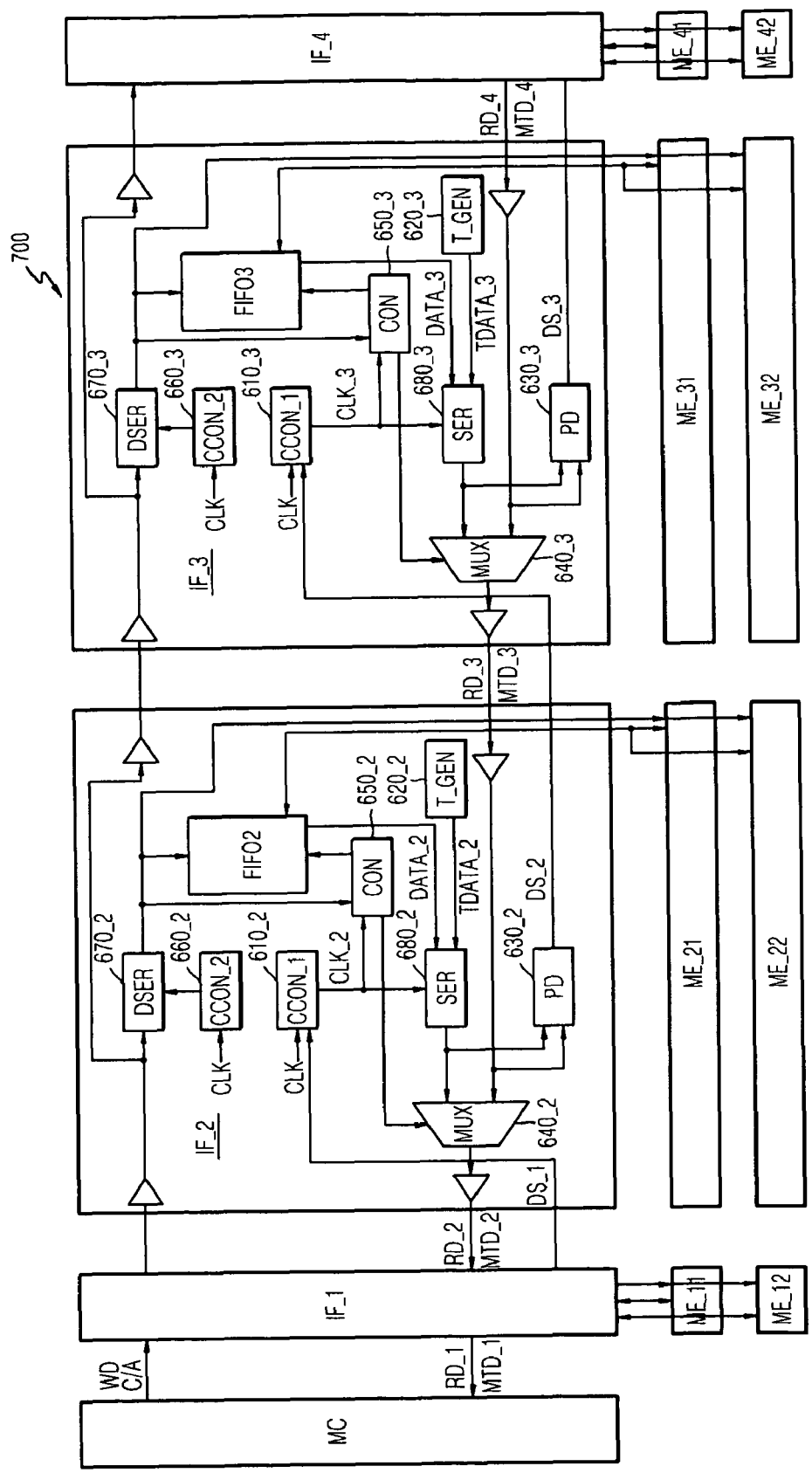
FIG. 6 is a block diagram of a memory system according to another embodiment of the present invention.

FIG. 6 is a block diagram of a memory system 700 according to another embodiment of the present invention.

Referring to FIG. 6, the memory system 700 may include a memory controller MC, first through fourth interface chips IF_1 through IF_4, and a plurality of memory chips ME_11 and ME_12, ME_21 and ME_22, ME_31 and ME_32, and ME_41 and ME_42 which respectively correspond to the first through fourth interface chips IF_1 through IF_4. For example, the memory system 700 includes a plurality of memory chips ME_11 and ME_12 corresponding to the first interface chip IF_1, a plurality of memory chips ME_21 and ME_22 corresponding to the second interface chip IF_2, a plurality of memory chips ME_31 and ME_32 corresponding to the third interface chip IF_3, and a plurality of memory chips ME_41 and ME_42 corresponding to the fourth interface chip IF_4.

Unlike the first through fourth memory chips ME_1 through ME_4 illustrated in FIG. 5, each of the first through fourth interface chips IF_1 through IF_4 of the memory system 700 does not include a memory core in which data is stored. Further, each of the first through fourth interface chips IF_1 through IF_4 exchange signals and data with their corresponding memory chips. Each element of the first through fourth interface chips IF_1 through IF_4 may function the same as its corresponding element of the first through fourth memory chips ME_1 through ME_4 illustrated in FIG. 5, and thus detailed descriptions thereof will be omitted here. The memory system 700 may determine a phase of a clock signal by using test data, as described above for the memory system 600 illustrated in FIG. 5. However, when the memory system 700 performs a read operation, data read from each memory chip is stored in a temporary storage unit of its corresponding interface chip. For example, if data is read from the memory chip ME_22, the data is stored in a temporary storage unit FIFO2 of the second interface chip IF_2. A method of transmitting read data to the memory controller MC by using the data stored in the temporary storage unit FIFO2 is described in detail above with reference to FIG. 5, and thus detailed descriptions thereof will be omitted here.

Further, unlike the memory system 600 of FIG. 5, each of the temporary storage units FIFO2 of the memory system 700 of FIG. 4 may store or output data read from a plurality of memory cores (not shown), where each memory chip ME_11 through ME_42 may include at least one memory core.

Figure 7:
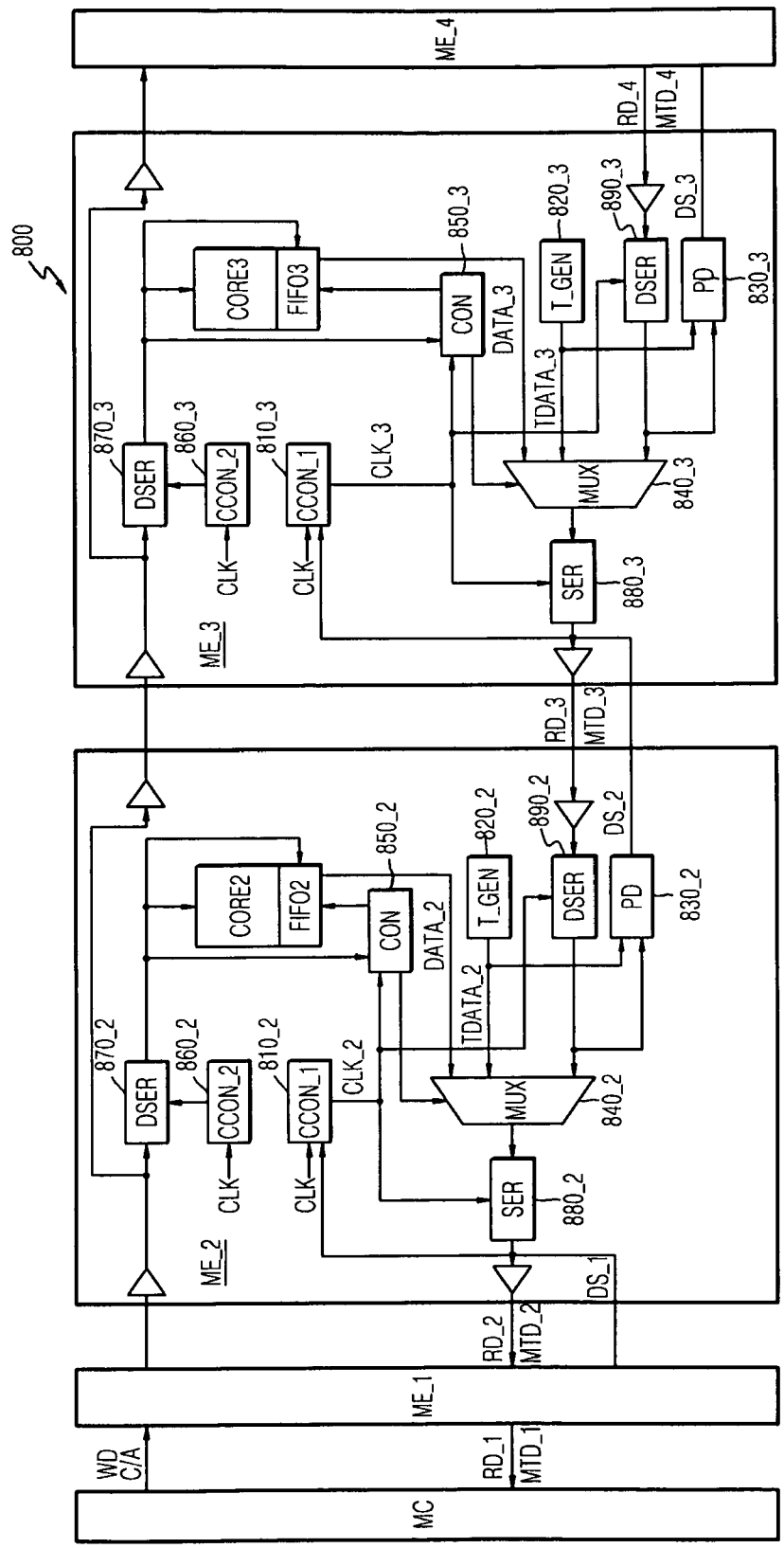
FIG. 7 is a block diagram of a memory system according to another embodiment of the present invention.

FIG. 7 is a block diagram of a memory system 800 according to another embodiment of the present invention.

In FIG. 7, a method of transmitting a signal or data from each memory chip will now be described in detail representatively with respect to second and third memory chips ME_2 and ME_3.

Unlike the memory system 600 illustrated in FIG. 5, in the memory system 800, a phase detection unit 830_2 may detect a phase difference between two types of data that are in a parallel form. For example, a test data generation unit 820_2 generates and outputs test data TDATA_2 in a parallel form. Also, a data parallel conversion unit 890_2 parallel-converts and outputs output test data MTD_3 of the third memory chip ME_3. A MUX 840_2 selects and outputs one of output test data of the test data generation unit 820_2 and output test data of the data parallel conversion unit 890_2, in response to a second control signal output from a control unit 850_2. A data serial conversion unit 880_2 serial-converts output test data of the MUX 840_2 and outputs the serial-converted data as output test data MTD_2 of the second memory chip ME_2. The above-described operation may be performed in the same manner in other memory chips, for example, the memory chips ME_1, ME_3 and ME_4.

In this case, the phase detection unit 830_2 detects a phase difference between the output test data of the test data generation unit 820_2 and the output test data of the data parallel conversion unit 890_2, and outputs the detected phase difference to the third memory chip ME_3, as a second detection signal DS_2. The output test data of the test data generation unit 820_2 and the output test data of the data parallel conversion unit 890_2 are in a parallel form. For example, according to the current embodiment of the present invention, the phase detection unit 830_2 detects a phase difference between two types of data that are in a parallel form. In this case, the number of times that parallel conversion is performed may be reduced in comparison to a conventional memory system, due to the same reason as the memory system 400 illustrated in FIG. 3.

Likewise, when a read operation is performed, data that is read in response to a read command is output from a temporary storage unit FIFO2 to the MUX 840_2 in response to the second control signal. Also, the data parallel conversion unit 890_2 parallel-converts and outputs output data RD_3 of the third memory chip ME_3. The MUX 840_2 selects and outputs one of output data of the temporary storage unit FIFO2 and output data of the data parallel conversion unit 890_2, in response to the second control signal. The data serial conversion unit 880_2 serial-converts output data of the MUX 840_2, and outputs the serial-converted data as output data RD_2 of the second memory chip ME_2. The read operation is performed the same in other memory chips. As described above, according to the current embodiment of the present invention, the number of times that parallel conversion is performed may be reduced in comparison to a conventional memory system. Thus, seamless switching may be implemented by minimizing or reducing power consumption and latency increases.

Figure 8:
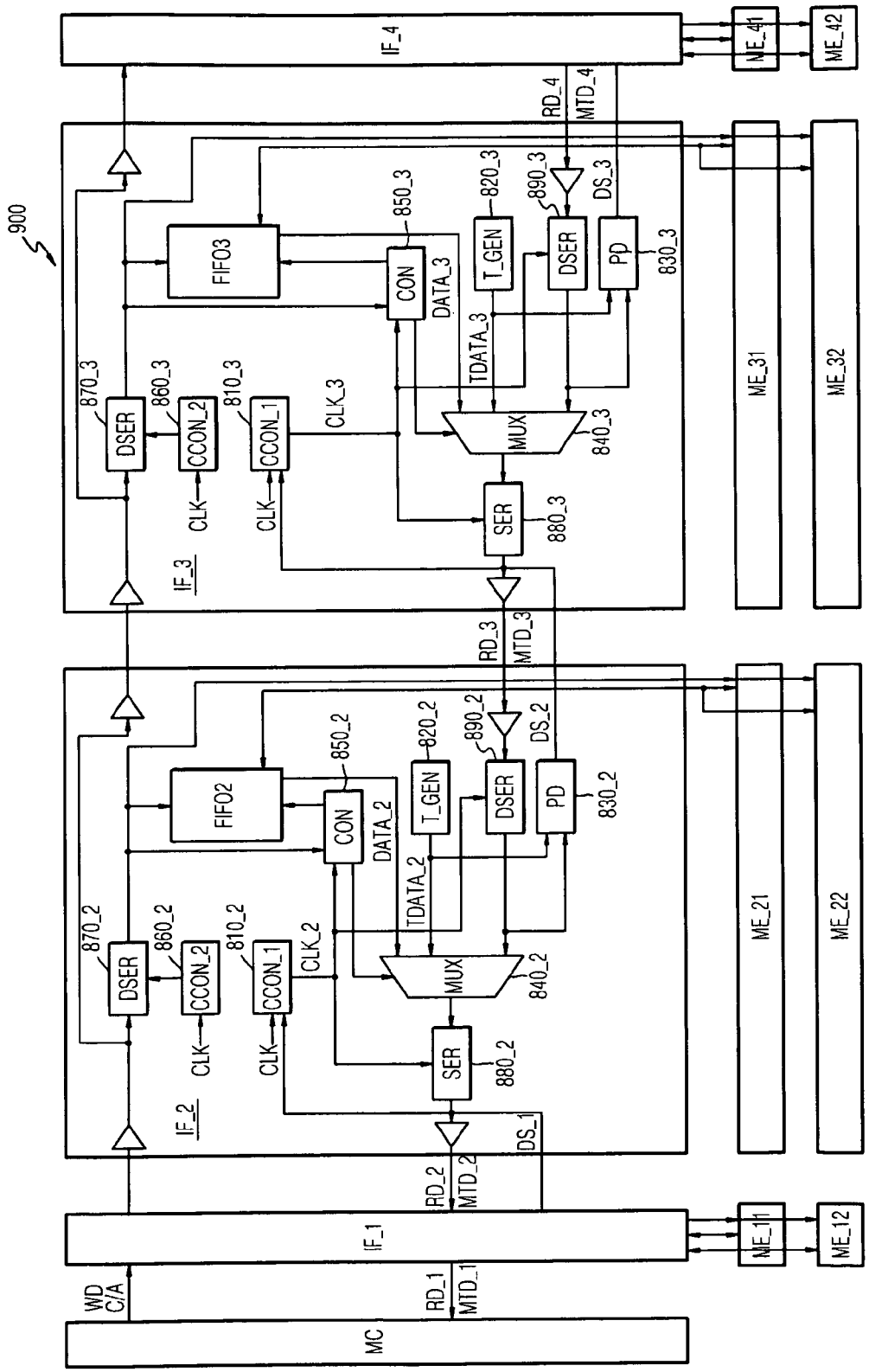
FIG. 8 is a block diagram of a memory system according to another embodiment of the present invention.

FIG. 8 is a block diagram of a memory system 900 according to another embodiment of the present invention.

Referring to FIG. 8, the memory system 900 may include a memory controller MC, first through fourth interface chips IF_1 through IF_4, and a plurality of memory chips ME_11 and ME_12, ME_21 and ME_22, ME_31 and ME_32, and ME_41 and ME_42 which respectively correspond to the first through fourth interface chips IF_1 through IF_4. For example, the memory system 900 includes the plurality of memory chips ME_11 and ME_12 corresponding to the first interface chip IF_1, the plurality of memory chips ME_21 and ME_22 corresponding to the second interface chip IF_2, the plurality of memory chips ME_31 and ME_32 corresponding to the third interface chip IF_3, and the plurality of memory chips ME_41 and ME_42 corresponding to the fourth interface chip IF_4.

Unlike the first through fourth memory chips ME_1 through ME_4 illustrated in FIG. 7, each of the first through fourth interface chips IF_1 through IF_4 of the memory system 900 does not include a memory core in which data is stored. Further, each of the first through fourth interface chips IF_1 through IF_4 exchange signals and data with their corresponding memory chips. Each element of the first through fourth interface chips IF_1 through IF_4 may function the same as its corresponding element of the first through fourth memory chips ME_1 through ME_4 illustrated in FIG. 7, and thus detailed descriptions thereof will be omitted here. The memory system 900 may determine a phase of a clock signal by using test data, as described above for the memory system 800 illustrated in FIG. 7. However, when the memory system 900 performs a read operation, data read from each memory chip is stored in a temporary storage unit of its corresponding interface chip. For example, if data is read from the memory chip ME_22, the data is stored in a temporary storage unit FIFO2 of the second interface chip IF_2. A method of transmitting read data to the memory controller MC by using the data stored in the temporary storage unit FIFO2 is described in detail above with reference to FIG. 7, and thus detailed descriptions thereof will be omitted here.

Further, unlike the memory system 800 of FIG. 7, each of the temporary storage units FIFO2 of the memory system 900 of FIG. 8 may store or output data read from a plurality of memory cores (not shown), where each memory chip ME_11 through ME_42 may include at least one memory core.

As described above, according to example embodiments of the present invention, reducing the number of times that re-sampling and data serial/parallel conversion are performed may minimize or reduce power consumption and latency increases.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A memory system comprising:
   first through mth chips, where m is a natural number, connected in the form of a daisy chain and configured to transmit at least one of signals and data;
   a (k−1)th chip of the first through mth chips, where k is a natural number and $2 \leq k \leq m$, configured to output a (k−1)th detection signal corresponding to a phase difference between (k−1)th test data of the (k−1)th chip and kth test data of a kth chip of the first through mth chips; and
   the kth chip including a clock phase control unit configured to control a phase of a received clock signal and to output the phase-controlled clock signal as a kth clock signal, where the clock phase control unit of the kth chip outputs the kth clock signal in response to the (k−1)th detection signal.

2. The memory system of claim 1, wherein the clock phase control unit of the kth chip outputs the kth clock signal in response to the (k−1)th detection signal so as not to generate the phase difference between the (k−1)th test data and output test data of the kth chip.

3. The memory system of claim 1, wherein the kth chip further includes,
   a phase detection unit configured to output a kth detection signal,
   a test data generation unit configured to generate and output kth test data in response to the kth clock signal, and
   a control unit configured to output a kth control signal in response to the kth clock signal.

4. The memory system of claim 3, wherein the (k−1)th chip further includes a first multiplexer (MUX) configured to select one of the (k−1)th test data and the output test data of the kth chip in response to a (k−1)th control signal, and to output the selected data as output test data of the (k−1)th chip.

5. The memory system of claim 4, wherein the output test data of the first through mth chips is in serial form.

6. The memory system of claim 3, wherein the (k−1)th chip further includes,
   a data parallel conversion unit configured to parallel-convert and output the output test data of the kth chip in response to a (k−1)th clock signal,
   a multiplexer (MUX) configured to select and output one of the (k−1)th test data and output test data of the data parallel conversion unit in response to a (k−1)th control signal, and
   a data serial conversion unit configured to serial-convert output test data of the MUX in response to the (k−1)th clock signal, and to output the serial-converted output test data of the MUX as output test data of the (k−1)th chip,
   wherein the (k−1)th test data is in a parallel form, and
   wherein the (k−1)th detection signal corresponds to a phase difference between the (k−1)th test data and the output test data of the data parallel conversion unit of the (k−1)th chip.

7. The memory system of claim 1, further comprising:
   a memory controller configured to control the first through mth chips, wherein each of the first through mth chips includes one of,
   a memory chip configured to include a memory core and to transmit data to and receive data from the memory controller, and
   an interface chip configured to transmit data and to receive data from a corresponding memory chip and the memory controller.

8. The memory system of claim 7, wherein the kth chip further includes,
   a control unit configured to output a kth control signal in response to the kth clock signal, and
   a temporary storage unit configured to at least one of store and output kth data read from the memory core of the kth chip in response to the kth control signal if the kth chip is the memory chip, and to at least one of store and output kth data read from the corresponding memory chip in response to the kth control signal if the kth chip is the interface chip.

9. The memory system of claim 8, wherein the kth chip further includes a data serial conversion unit configured to serial-convert the kth data in response to the kth clock signal, and to output the serial-converted data as kth serial data, when a read operation is performed, and
   wherein the (k−1)th chip further includes a multiplexer (MUX) configured to select one of (k−1)th serial data and to output data of the kth chip in response to a (k−1)th control signal, and to output the selected data as output data of the (k−1)th chip, when the read operation is performed.

10. The memory system of claim 8, wherein the (k−1)th chip further includes,
    a data parallel conversion unit configured to parallel-convert and output data of the kth chip in response to a (k−1)th clock signal, when a read operation is performed,
    a multiplexer (MUX) configured to select and output one of (k−1)th data and output data of the data parallel conversion unit in response to a (k−1)th control signal, when the read operation is performed, and
    a data serial conversion unit configured to serial-convert output data of the MUX in response to the (k−1)th clock signal and to output the serial-converted output data of the MUX as output data of the (k−1)th chip, when the read operation is performed,
    wherein the (k−1)th detection signal corresponds to a phase difference between the (k−1)th test data and the output data of the data parallel conversion unit of the (k−1)th chip.

11. The memory system of claim 1, wherein the (k−1)th chip transmits write data in a serial form to the kth chip without converting the write data to a parallel form, when write data is transmitted.

12. The memory system of claim 1, wherein the kth chip further includes,
    a data serial conversion unit configured to output at least one of kth test data obtained by serial-converting received test data and kth data obtained by serial-converting read data, in response to the kth clock signal.

13. The memory system of claim 12, wherein the kth chip further includes,
    a phase detection unit configured to output a kth detection signal, and
    a control unit configured to output a kth control signal in response to the kth clock signal.

14. The memory system of claim 13, wherein the (k−1)th chip further includes a multiplexer (MUX) configured to select one of the (k−1)th test data and output test data of the kth chip in response to a (k−1)th control signal, and to output the selected data as output test data of the (k−1)th chip.

15. The memory system of claim 12, wherein the kth chip further includes a test data generation unit configured to generate the kth test data and to output the kth test data to the data serial conversion unit.

16. The memory system of claim 1, wherein the kth chip further includes,
   a control unit configured to output a kth control signal in response to the kth clock signal, and
   a multiplexer (MUX) configured to select and output one of received data in response to the kth control signal, with the MUX of a (k−1)th chip selecting and outputting one of received (k−1)th test data and parallel-converted output test data of a kth chip, in response to a (k−1)th control signal.

17. The memory system of claim 16, wherein the clock phase control unit of the kth chip outputs the kth clock signal in response to the (k−1)th detection signal so as not to generate the phase difference between the (k−1)th test data and the output test data of the kth chip.

18. The memory system of claim 16, wherein the kth chip further includes,
   a phase detection unit configured to output a kth detection signal,
   a test data generation unit configured to generate the (k−1)th test data, and
   a data parallel conversion unit configured to parallel-convert and output the output test data of the kth chip in response to a (k−1)th clock signal, and
   a data serial conversion unit configured to serial-convert output test data of the MUX in response to the (k−1)th clock signal, and to output the serial-converted output test data of the MUX as output test data of the (k−1)th chip.

19. The memory system of claim 18, wherein the (k−1)th detection signal corresponds to a phase difference between the (k−1)th test data and the output test data of the data parallel conversion unit of the (k−1)th chip.

20. The memory system of claim 18, wherein the data parallel conversion unit of the (k−1)th chip parallel-converts and outputs output data of the kth chip in response to a (k−1)th clock signal, when a read operation is performed;
   wherein the MUX of the (k−1)th chip selects and outputs one of (k−1)th data and output data of the data parallel conversion unit of the (k−1)th chip in response to a (k−1)th control signal, when the read operation is performed; and
   wherein the data serial conversion unit of the (k−1)th chip serial-converts output data of the MUX in response to the (k−1)th clock signal, and outputs the serial-converted output data of the MUX as output data of the (k−1)th chip, when the read operation is performed.

* * * * *